US010043894B2

(12) United States Patent
Dinh et al.

(10) Patent No.: US 10,043,894 B2
(45) Date of Patent: Aug. 7, 2018

(54) TRANSISTOR AMPLIFIER CIRCUIT AND INTEGRATED CIRCUIT

(71) Applicant: NXP B.V., Eindhoven (NL)

(72) Inventors: Viet Thanh Dinh, Heverlee (BE); Tony Vanhoucke, Bierbeek (BE); Evelyne Gridelet, Omal (BE); Anco Heringa, Waalre (NL); Jan Willem Slotboom, Eersel (NL); Dirk Klaassen, Waalre (NL)

(73) Assignee: NXP B.V., Eindhoven (NL)

( * ) Notice: Subject to any disclaimer, the term of this patent is extended or adjusted under 35 U.S.C. 154(b) by 213 days.

(21) Appl. No.: 14/542,990

(22) Filed: Nov. 17, 2014

(65) Prior Publication Data

US 2015/0145005 A1    May 28, 2015

(30) Foreign Application Priority Data

Nov. 28, 2013  (EP) .................................. 13194868

(51) Int. Cl.
*H01L 29/737* (2006.01)
*H01L 29/06* (2006.01)
(Continued)

(52) U.S. Cl.
CPC ...... *H01L 29/7371* (2013.01); *H01L 29/0607* (2013.01); *H01L 29/0649* (2013.01);
(Continued)

(58) Field of Classification Search
CPC .......................... H01L 29/161; H01L 29/3771
See application file for complete search history.

(56) References Cited

U.S. PATENT DOCUMENTS 6,770,018 B2    8/2004  Russ et al.
2006/0071236 A1*  4/2006  Jensen ................ H01L 29/7302
                                                  257/133
(Continued)

FOREIGN PATENT DOCUMENTS

EP      2 800 127 A1    11/2014

OTHER PUBLICATIONS

Greenberg, D. R., et al; "Large-Signal Performance of High-BV$_{CEO}$ Graded EPI-Base SiGe HBTs at Wireless Frequencies"; IEEE IEDM'97 Technical Digest; pp. 799-802 (1997).

(Continued)

*Primary Examiner* — Fernando L Toledo
*Assistant Examiner* — Lawrence-Linh T Nguyen

(57) ABSTRACT

Disclosed is a transistor having a first region of a first conductivity type for injecting charge carriers into the transistor and a laterally extended second region of the first conductivity type having a portion including a contact terminal for draining said charge carriers from the transistor, wherein the first region is separated from the second region by an intermediate region of a second conductivity type defining a first p-n junction with the first region and a second p-n junction with the second region, wherein the laterally extended region separates the portion from the second p-n junction, and wherein the transistor further comprises a substrate having a doped region of the second conductivity type, said doped region being in contact with and extending along the laterally extended second region and a further contact terminal connected to the doped region for draining minority charge carriers from the laterally extended second region. An amplifier circuit and IC including such transistors are also disclosed.

15 Claims, 8 Drawing Sheets

(51) Int. Cl.
*H01L 29/735* (2006.01)
*H01L 29/78* (2006.01)
*H01L 29/165* (2006.01)

(52) U.S. Cl.
CPC ........ *H01L 29/735* (2013.01); *H01L 29/7378* (2013.01); *H01L 29/0653* (2013.01); *H01L 29/165* (2013.01); *H01L 29/7809* (2013.01); *H01L 29/7835* (2013.01)

(56) References Cited

U.S. PATENT DOCUMENTS

| | | | | |
|---|---|---|---|---|
| 2007/0023866 | A1* | 2/2007 | Chatty | H01L 27/0262 257/575 |
| 2009/0179228 | A1* | 7/2009 | Joseph | H01L 29/0817 257/197 |
| 2010/0044750 | A1* | 2/2010 | Imahashi | H01L 27/0262 257/173 |
| 2011/0169564 | A1 | 7/2011 | Jensen et al. | |
| 2012/0119262 | A1* | 5/2012 | Noort | H01L 29/7371 257/197 |
| 2013/0075730 | A1* | 3/2013 | Qian | H01L 29/42304 257/51 |
| 2014/0312356 | A1 | 10/2014 | Vanhoucke et al. | |

OTHER PUBLICATIONS

Preisler, E. J., et al; "Integration of a 5.5V BVECO SiGe HBT within a 200GHz SiGe BiCMOS Flow"; IEEE Bipolar/BiCMOS Circuits and Technology Meeting; pp. 202-205 (2007).

Geynet, B., et al; "High-Voltage HBTs Compatible with High-Speed SiGe BiCMOS Technology"; IEEE Topical Meeting on Silicon Monolithic Integrated Circuits in RF Systems; pp. 210-213 (2008).

Mertens, H., et al; "Extended High Voltage HBTs in High-Performance BiCMOS Process"; IEEE Bipolar/BiCMOS Circuits and Technology Meeting; pp. 158-161; (2011).

Melai, J., et al; A New Sub-Micron 24 V SiGe:C resurf HBT; IEEE 16th Intl. Symposium on Power Semiconductor Devices and ICs; pp. 33-36 (2004).

Larson, Lawrence E; "Silicon Technology Tradeoffs for Radio-Frequency/Mixed-Signal System-on-a-chip"; IEEE Trans. On Electron Devices, vol. 50, No. 3; pp. 683-699 (Mar. 2003).

Vanhoucke, Tony et al; "Physical Description of the Mixed-Mode Degradation Mechanism for High Performance Bipolar Transistors"; Bipolar/BiCMOS Circuits and Technology Meeting; pp. 1-4; (2006).

Hueting, R.J.E., et al; "A New Trench Bipolar Transistor for RF Applications"; IEEE Trans. on Electron Devices, vol. 51, Issue 7; pp. 1108-01113 (2004).

Donkers, J.J.T.M., et al; "Metal Emitter SiGe:C HBTs"; IEEE Intl. Electron Devices Meeting, IEDM Technical Digest; pp. 243-246 (2004).

Mans, Pierre-Marie. et al; "SiGe HBTs Optimization for Wireless Power Amplifier Applications"; Active and Passive Electronics Components, vol. 2010, Article ID 542572; Hindawi Publishing; 6 pages Corp (2010).

Sorge, R. et al; "Concept of Vertical Bipolar Transistor with Lateral Drift Region, Applied to High Voltage SiGe HBT"; IEEE 12th Topical Meeting on Silicon Monolithic Integrated Circuits in RF Systems; pp. 223-226 (2012).

Extended European Search Report for Application No. 13194868.9 (Apr. 14, 2014).

* cited by examiner

TRANSISTOR AMPLIFIER CIRCUIT AND INTEGRATED CIRCUIT

CROSS-REFERENCE TO RELATED APPLICATIONS

This application claims the priority under 35 U.S.C. § 119 of European patent application no. 13194868.9, filed on Nov. 28, 2013, the contents of which are incorporated by reference herein.

The present invention relates to a transistor having a first region of a first conductivity type for injecting charge carriers into the transistor and a second region of the first conductivity type having a portion including a contact terminal for draining said charge carriers from the transistor, wherein the first region is separated from the second region by an intermediate region of a second conductivity type defining a first p-n junction with the first region and a second p-n junction with the second region.

The present invention further relates to an amplifier circuit comprising such a transistor.

The present invention yet further relates to an integrated circuit (IC) comprising such a transistor.

RF power amplifiers are key components in any high-frequency system and application. The demand of higher bandwidth and higher speed for multimedia applications puts stringent requirements on these amplifiers, which include output power, linearity and efficiency. Currently, heterojunction bipolar transistors (HBT) are commonly chosen instead of CMOS-based devices for radio-frequency (RF) power amplifiers due to the excellent performance of HBTs at high frequencies. Although III-V transistors (e.g. GaAs) are sometimes used in this application domain due to their superior material properties, SiGe HBTs are more cost-effective and can be integrated in a more straightforward manner in existing manufacturing process flows such as CMOS process flows. Therefore, there is a trend towards using e.g. SiGe HBTs instead of GaAs-based bipolar transistors where possible.

The lower bandgap of Si, i.e. smaller breakdown electric field in Si-based devices, prevents SiGe HBTs to operate at high voltages to provide the power required in some application domains, such as RF power amplifiers. Several efforts have been made to create higher-breakdown SiGe HBTs following either traditional optimization in collector profiles using breakdown voltage (BV) and cut-off frequency ($f_T$) trade-off, or by taking advantage of RESURF effects to achieve a performance improvement in term of $BV \times f_T$.

One of the main differences between HBTs and MOSFETs is that a HBT typically exhibits two breakdown voltages, namely open-base breakdown ($BV_{CEO}$) and open-emitter breakdown ($BV_{CBO}$), instead of only one breakdown voltage ($V_{DS}$) in MOSFETs, although in MOSFETs a parasitic bipolar device is present in the form of the source-well-drain structure having breakdown characteristics resembling those of bipolar transistors, in particular when the well is shorted with the source. The effects are quite similar as in bipolar transistors with the Id(Vd) curve snapping back at breakdown. This induces dangerous instabilities, albeit slightly less strong because the MOSFET parasitic bipolar transistor has a smaller amplification than an 'intentional' bipolar transistor such as a HBT.

In bipolar devices, e.g. an NPN transistor, the collector current is given by the number of electrons flowing from the emitter to the collector determined by the voltage across the base-emitter junction at given (low) base-collector voltages. For higher base-collector voltages, however, electrons flowing from the emitter into the collector generate additional electron hole pairs by the process of impact ionization because of the reverse bias at base-collector junction. The generated electrons flow towards the collector region, thereby increasing the total collector current sensed at the collector terminal. The generated holes, however, are forced to travel towards the base due to the electric field in the base-collector and in case of constant base-emitter voltage ($V_{BE}$), the external base current required to "feed" the transistor will lower by the same amount of generated holes. As a consequence, at sufficiently high base-collector voltages ($V_{BC}$), the number of generated holes due to impact ionization is identical to the number of holes provided externally into the base contact, thus making the external base current zero. The voltage where the external base current becomes zero is defined as $BV_{CEO}$.

Since the amount of holes which are needed in the base contact to generate a specific collector current (i.e. a given electron current through the base-collector junction) is determined by the current gain, $BV_{CEO}$ also depends on the current gain defined as the ratio between the collector and base current. For this reason, $BV_{CEO}$ is also referred to as "open-base breakdown voltage" since at this collector-emitter voltage ($V_{CE}$) the external base current is zero, i.e. open terminal. Further increasing the $V_{CE}$, i.e. above $BV_{CEO}$, results in a hole current flow going out of the base terminal giving an external negative base current. It should be understood that $BV_{CEO}$ is not a hard breakdown since at collector-emitter voltages exceeding $BV_{CEO}$ the transistor is still operating.

In addition to $BV_{CEO}$, bipolar transistors exhibit another breakdown voltage. As mentioned above, since the high electric field in such a transistor appears at the reversed biased base-collector junction, the impact ionization phenomenon mainly occurs at this junction. Therefore, the maximum reverse voltage which can be applied to this junction before breakdown leads to the condition that the emitter terminal is open, i.e. (almost) no electrons are injected into the base by the emitter is called $BV_{CBO}$. This breakdown voltage can be seen as a hard breakdown for the device and collector-emitter voltages exceeding $BV_{CBO}$ will result in destructive device failure.

From the above definitions of $BV_{CEO}$ and $BV_{CBO}$, it will be clear that $BV_{CEO}$ is much smaller than $BV_{CBO}$ in most transistor designs, and $BV_{CEO}$ cannot be seen as a hard breakdown limit for the transistor. However, at voltages larger than $BV_{CEO}$, due to the increase of electron-hole pairs generated by impact ionization, issues of reliability (or degradation) and distortion of the transistor characteristics are of great concern. Therefore, IC designers often take $BV_{CEO}$ as a design limit when designing power amplifiers, thus resulting in limited amplification due to the limitations placed on the maximum value of $V_{CE}$.

$BV_{CEO}$ depends on two factors, namely the electric field inside the transistor as determined by $V_{BC}$ and collector doping levels, and the current gain as determined by the required amount of holes in the base to generate a specific collector current. Reducing the electric field will increase the breakdown voltage which can be done by for example reducing or reshaping the electric field in the base-collector junction. On the other hand, the amount of negative base current for a given base-collector voltage can be reduced by reducing the current gain.

R. Sorge et al. in IEEE 12th Topical Meeting on Silicon Monolithic Integrated Circuits in RF Systems (SiRF), pages 223-226 (2012) disclose a bipolar transistor comprising a vertical layer sequence of emitter, base and collector, in which the collector comprises a doped inner collector region of a first conductivity type and a collector connecting region of the first conductivity type, which is doped more in comparison with the inner collector region, and in which a collector drift region of the first conductivity type, which is doped less in comparison with the inner collector region and has no buried, highly doped layer of the same conductivity type, i.e. without sub-collector, arranged beneath, adjoins the inner collector region in a lateral direction which is oriented perpendicular to a vertical stacking direction of the layer sequence, the inner collector region being connected to the collector connecting region via said collector drift region. The lateral drift region facilitates a RESURF effect in the collector near the collector terminal that allows for the transistor to be operated at higher $V_{CE}$.

The present invention seeks to provide a transistor that can be operated at yet higher $V_{CE}$ before $BV_{CEO}$ occurs The present invention further seeks to provide an amplifier circuit including such a transistor.

The present invention yet further seeks to provide an IC including such a transistor.

According to an aspect, there is provided a transistor having a first region of a first conductivity type for injecting charge carriers into the transistor and a laterally extended second region of the first conductivity type having a portion including a contact terminal for draining said charge carriers from the transistor, wherein the first region is separated from the second region by an intermediate region of a second conductivity type defining a first p-n junction with the first region and a second p-n junction with the second region, wherein the laterally extended region separates the portion from the second p-n junction, and wherein the transistor further comprises a substrate having a doped region of the second conductivity type, said doped region being in contact with and extending along the laterally extended second region; and a further contact terminal connected to the doped region for draining minority charge carriers from the laterally extended second region.

In such a device, the doped region underneath the more lowly doped lateral second region creates a junction which can be used to introduce a RESURF effect at this junction as well as at the further contact terminal. Compared to conventional devices without junction RESURF, the field at the base-collector junction at the same $V_{CE}$ is reduced by the RESURF effect, and the field at the doped region-collector junction increases. This field redistribution reduces the impact ionization at the base-collector junction, which drastically increases the voltage at which the base current changes its sign, i.e. drastically increases $BV_{CEO}$.

In a particular advantageous embodiment, the doped region has a higher doping concentration than the second region, wherein the maximum concentration of the doping in the doped region optionally is in the range of $10^{17}$-$10^{19}$ cm$^{-3}$.

The first conductivity type may be n-type and the second conductivity type may be p-type. Alternatively, the first conductivity type may be p-type and the second conductivity type may be n-type.

The transistor preferably is a bipolar transistor and more preferably is a vertical bipolar transistor in which the first region is an emitter region, the intermediate region is a base region and the laterally extended second region is a collector region, wherein the collector region is formed in the substrate, the base region is formed on the collector region and the emitter region is formed on the base region as the present invention when applied to a vertical bipolar transistor can yield a device that can be operated at particularly high $V_{CE}$, thus significantly improving the amplification characteristics of the device.

In an embodiment, the portion may be laterally separated from the second p-n junction by a trench insulation region, said collector region extending from the second p-n junction to the portion underneath the trench insulation region.

A particularly advantageous vertical bipolar transistor is obtained if the collector region has a thickness in the range of 0.1-1.0 µm and a concentration of an impurity of the first conductivity type in the range of $10^{16}$-$10^{19}$ cm$^{-3}$. The collector region preferably laterally extends over a width in the range of 0.5-5.0 µm.

The vertical bipolar transistor may be a heterojunction bipolar transistor comprising a SiGe base region as such HBTs are particularly well-suited for RF applications.

Alternatively, the transistor may be a lateral bipolar transistor in which the first region is an emitter region, the intermediate region is a base region and the laterally extended second region is a collector region, wherein the emitter region, the base region and the collector region each are formed in the substrate and laterally separated from each other, and wherein the emitter region and the base region are separated from the doped region by a patterned electrically insulating layer. Such transistor also benefit from improved $BV_{CEO}$ characteristics by the provision of the combination of the (extended) lateral collector region and the buried doped region providing the junction RESURF effect with the lateral collector region.

In yet another alternative embodiment, the transistor may be a MOS transistor in which the first region is a source region and the second region is a drain region including a drift region, and wherein the intermediate region is a well comprising the first region, the transistor further comprising a channel region in between the source region and the drain region. As explained in the introduction, the adverse effects of the parasitic bipolar transistor formed by the source—well-drift region can be alleviated by the presence of the buried doped layer for the same reasons as explained above.

According to another aspect, there is provided an amplifier circuit comprising the transistor according to one or more embodiments of the present invention. Such an amplifier circuit, e.g. an RF amplifier circuit, benefits from improved amplification and breakdown characteristics without significantly compromising ease of integration in existing manufacturing process flows.

According to yet another aspect, there is provided an integrated circuit comprising the transistor according to one or more embodiments of the present invention. Such an IC benefits from improved amplification and breakdown characteristics without significantly compromising ease of integration in existing manufacturing process flows. In an embodiment, the IC comprises an amplifier circuit including the transistor according to one or more embodiments of the present invention.

Embodiments of the invention are described in more detail and by way of non-limiting examples with reference to the accompanying drawings, wherein:

FIG. 1 depicts the hole current distribution above $BV_{CEO}$ in a conventional vertical HBT;

FIG. 2 schematically depicts a transistor in accordance with an embodiment of the present invention;

Figure 9:
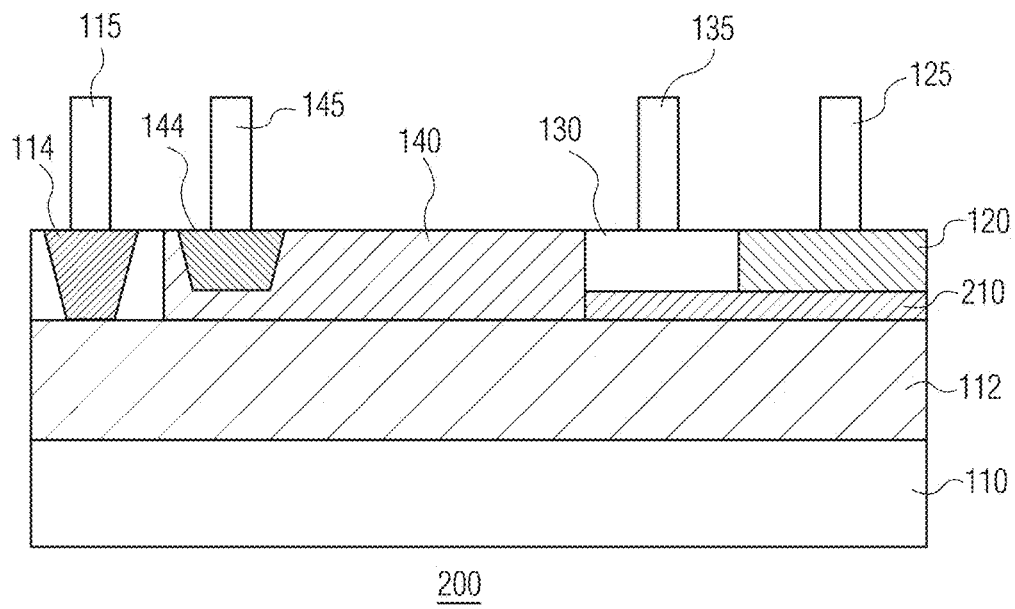
Figure 10:
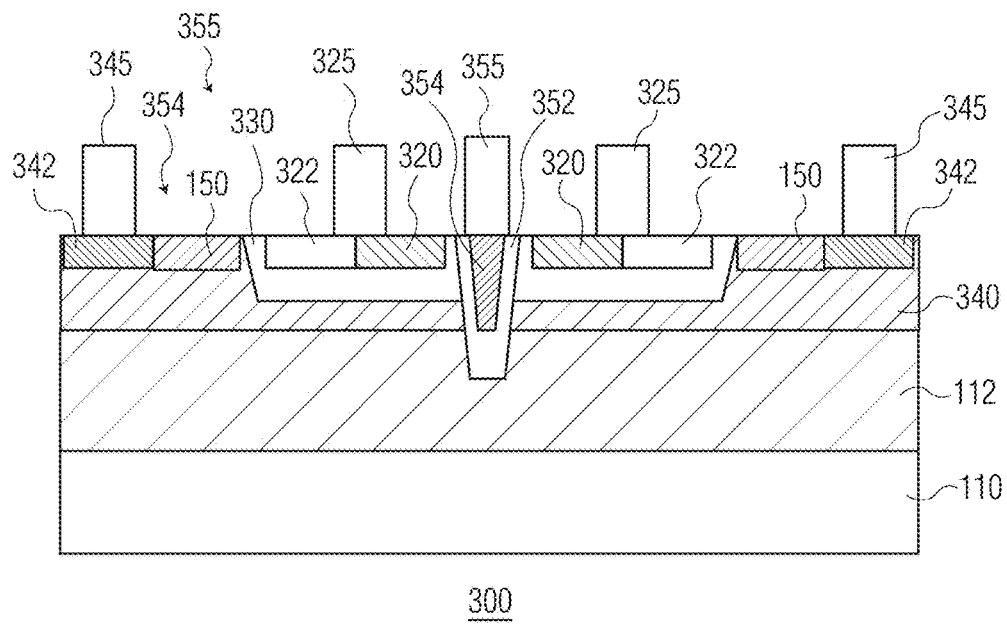

FIG. 9 schematically depicts a transistor in accordance with another embodiment of the present invention;

FIG. 10 schematically depicts a transistor in accordance with yet another embodiment of the present invention; and.

Figure 11:
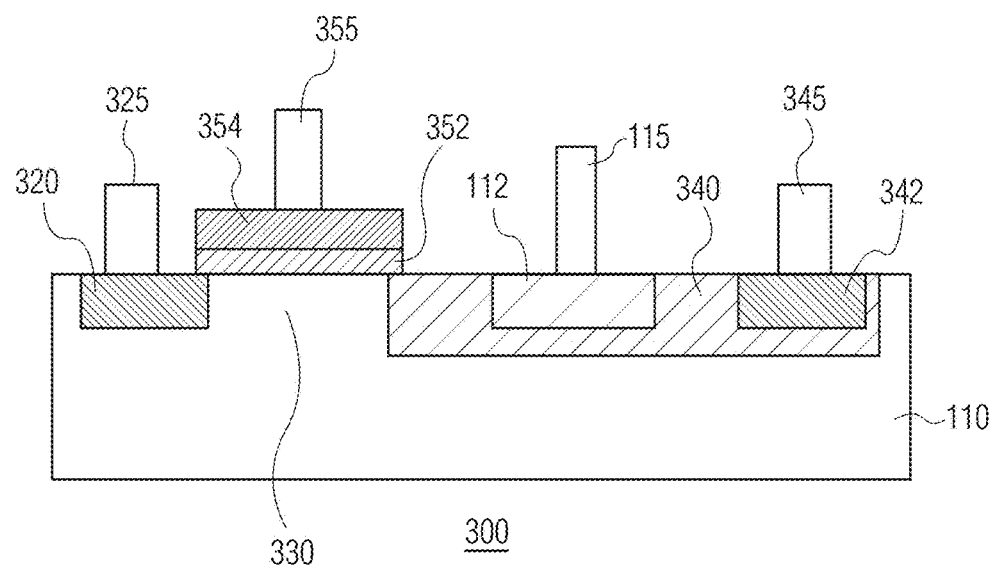

FIG. 11 schematically depicts a transistor in accordance with yet another embodiment of the present invention.

It should be understood that the Figures are merely schematic and are not drawn to scale. It should also be understood that the same reference numerals are used throughout the Figures to indicate the same or similar parts.

Figure 1:
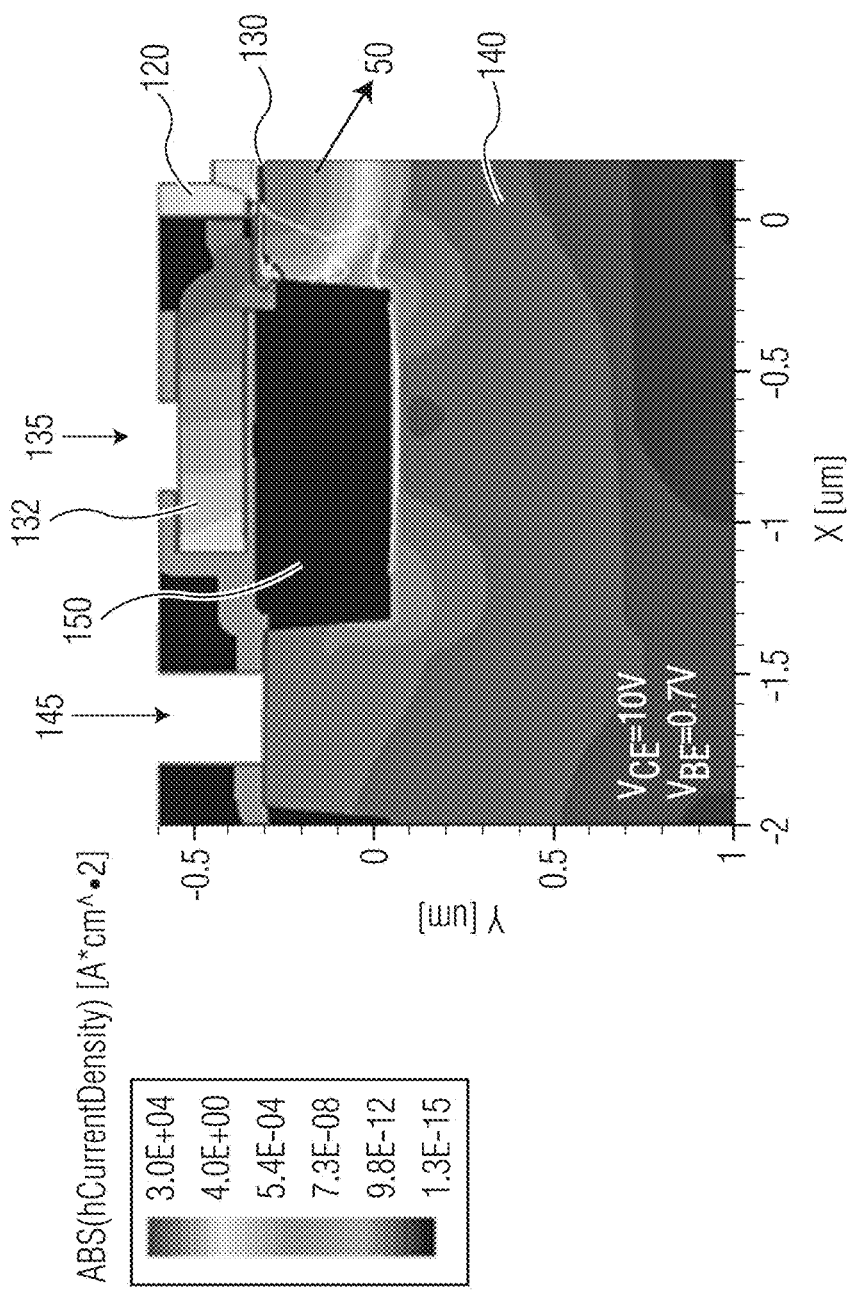

FIG. 1 depicts the hole current distribution above $BV_{CEO}$ in a conventional vertical HBT having an n-type (e.g. arsenic) doped poly (or mono) silicon emitter 120 on a p-type (e.g. boron) doped SiGe base region 130 having a contact 135 on a base contact region 130 and a vertically n-type (e.g. arsenic) implanted collector region 140 with a collector contact 145 separated from the base-collector p-n junction by shallow trench insulation 150. As is well-known, such a vertically implanted collector region 140 typically has a graded doping profile that increases in concentration in a direction away from the collector-base p-n junction, with a buried portion of the highest impurity concentration laterally extending through the substrate to under the contact 145, where this portion vertically extends to this contact to provide the electrical connection between the collector 140 and the collector contact 145.

At normal operating condition in such vertical bipolar transistors, the base-emitter junction is forward biased while the collector-base junction is reversed biased. Therefore, a high electric field appears at the base-collector junction. This electrical field increases with increased $V_{CB}$. The holes generated from the impact ionization process in the region of high electric field travel to the base region 130, which can cause the change of the base sign depending on $V_{CB}$.

TCAD simulations to obtain the hole distribution in this device have been performed, and are shown in FIG. 1 for $V_{BE}=0.7V$ and $V_{CE}=10V$. It is noted that in this device, $BV_{CEO}$ is approximately 5V. There are two relevant phenomena which can be observed from FIG. 1. Firstly, the electric field forces the hole current generated by impact ionization at high $V_{CE}$, i.e. VCE≥5V in this example, to migrate to the base. This can be seen by the high hole current density 50 at the base-collector junction in FIG. 1. Secondly, since the highest electric field occurs at the base-collector junction, the impact ionization significantly concentrates around this region only. These two issues seriously complicate the provision of bipolar transistors in mainstream technologies that exhibit improved $BV_{CEO}$ characteristics.

Figure 2:
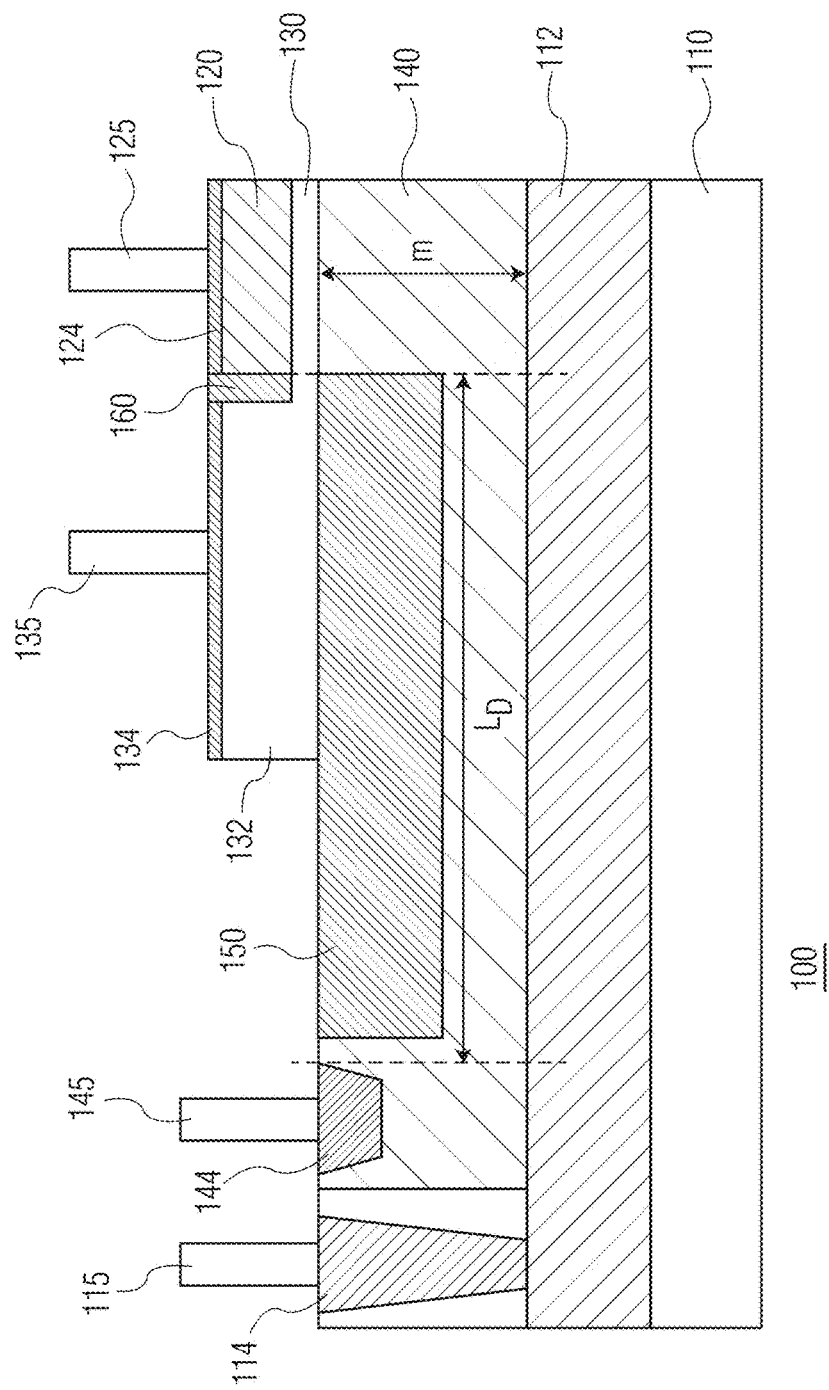

The present inventors have realized that this problem can be addressed by the provision of a bipolar transistor 100 as schematically shown in FIG. 2. Compared to the vertical bipolar transistor shown in FIG. 1, the vertically implanted collector region 140 has been replaced by a lateral collector region 140 comprising a doping profile of a first conductivity type, e.g. an n-type impurity such as arsenic, that laterally extends from the collector-base junction to the contact region 144 of the collector region 140, which contact region 144 typically comprises an impurity of the first conductivity type, e.g. an n-type impurity such as arsenic, at a higher concentration than the collector region 140. A contact terminal 145 is conductively coupled to the contact region 144. The lateral collector region 140 may have a linear (constant) doping profile to increase BV, high linearity as well as $f_{MAX}$, or may have a graded profile in case an increase in $f_T$ is desired.

In addition, the substrate 110 comprises a doped region 112, which has been doped with an impurity of a second conductivity type of opposite sign to the first conductivity type, e.g. a p-type impurity such as boron. Optionally, the region 112 has a higher impurity concentration than the laterally extended collector region 140 to increase the RESURF effect at this junction; for instance, the doped region 112 may have an impurity concentration in the range of $10^{17}$-$10^{19}$ cm$^{-3}$, whereas the laterally extended collector region 140 may have an impurity concentration in the range of $10^{16}$-$10^{19}$ cm$^{-3}$, e.g. in the range of $10^{17}$-$5*10^{18}$ cm$^{-3}$ although it should be understood that the doped region 112 and the laterally extended collector region 140 may have any suitable impurity concentration These layers may be formed in any suitable manner. For instance, a substrate 110 may be provided in which the highly doped region 112 is formed at the upper surface of the substrate 110, after which an epitaxially grown layer, e.g. a silicon layer, may be formed over the doped substrate 110, which epitaxially grown layer may be subsequently doped to form the collector region 140.

The remainder of the vertical bipolar transistor 100 may be formed in any suitable manner using any suitable design. Typically, such a vertical bipolar transistor 100 may comprise a base region 130 and a base contact region 132, which optionally may have a silicided surface 134 for providing a low-ohmic contact surface for the base contact terminal 135. The base region 130 (and the base contact region 132) typically comprises an impurity of a second conductivity type, e.g. a p-type impurity such as boron. The base contact region 132 may be electrically insulated from the collector region 140 in any suitable manner, e.g. by providing an electrically insulating structure 150 such as shallow trench isolation (STI) in between the base contact region 132 and the collector region 140. Such an electrically insulating structure 150 may be formed of any suitable electrically insulating material, e.g. a suitable oxide such as silicon oxide.

In an embodiment, the electrically insulating structure 150 may be replaced by a further region of the second conductivity type in order to create a further p-n junction between the collector region 140 under the collector-base junction and this further region. This further region may be used to provide a further escape route for the minority charge carriers from the collector region 140, i.e. to create an additional RESURF effect at the top of the transistor 100. Alternatively, this further region may take the place of the doped region 112.

In an embodiment, the base region 130 may be a SiGe-based base region 130, in which case the vertical bipolar transistor is a vertical HBT. In a particularly advantageous embodiment, the base region 130 comprises a Si/SiGe:C layer stack, which by way of non-limiting example may be formed as follows. Prior to the growth of the epitaxial base layer, the exposed silicon surfaces may be passivated by a hydrogen bake. The base layer is formed by first growing an undoped Si buffer layer, followed by the growth of an undoped SiGe:C collector-base spacer, a boron-doped SiGe:C base, an undoped SiGe:C base-emitter spacer and a doped Si emitter cap. The carbon content in the SiGe layers may be selected in the range of 0.1-0.3 atom % and the germanium content may be selected in the range of 15-30 atom % in these layers. The carbon in the SiGe:C layers prevents the outdiffusion of boron impurities from the boron-doped base, as is known per se. However, it should be understood that the exact composition and structure of the base in the bipolar transistor of the present invention is not important; any suitable base construction may be chosen.

An emitter region 120 is formed on the base region 130 and is electrically insulated from the base contact region 132 by an electrically insulating spacer 160. Such a spacer 160 may be realized in any suitable manner, for instance by providing a stack such as an ONO stack of electrically insulating layers on the vertical surface of the base contact region 132. The emitter region 120 for instance may be a mono- or polysilicon region (highly) doped with an impurity of the first conductivity type, e.g. an n-type impurity such as arsenic to provide an NPN bipolar transistor. The emitter region 120 optionally may include a silicided surface 124 for providing a low-ohmic contact region with the emitter contact terminal 125.

The substrate 110 further comprises a highly doped plug 114 extending between a further contact terminal 115 and the highly doped buried region 112 in order to provide a contact to the highly doped buried region 112. The highly doped plug 114 may be located in any suitable location, which is typically outside the region defining the transistor 100. Although the further contact terminal 115 is shown on the same side as the other terminals, it should be understood that it is equally feasible to provide the further contact terminal 115 at the back side of the substrate 110. It is known per se to provide contact terminals at a back side of a substrate such that this is not explained in further detail for the sake of brevity. Although not shown in FIG. 2, the highly doped plug 114 may be laterally separated from the collector contact region 144 by an isolation structure, e.g. shallow trench isolation (STI) or deep trench isolation (DTI).

The doped buried region 112 containing an impurity of the second conductivity type, e.g. a $p^+$ layer, below the laterally extending collector region 140 comprising an impurity of the first conductivity type, e.g. an $n^-$ epi collector, creates a further p-n junction which can be used to introduce a junction RESURF effect. Consequently, compared to conventional devices without junction RESURF, for the same $V_{CE}$, the field at the base-collector junction is reduced by the RESURF effect. This field redistribution reduces the impact ionization at the base-collector junction, which drastically increases the voltage at which the base current changes its sign, i.e. drastically increases $BV_{CEO}$.

Figure 3:
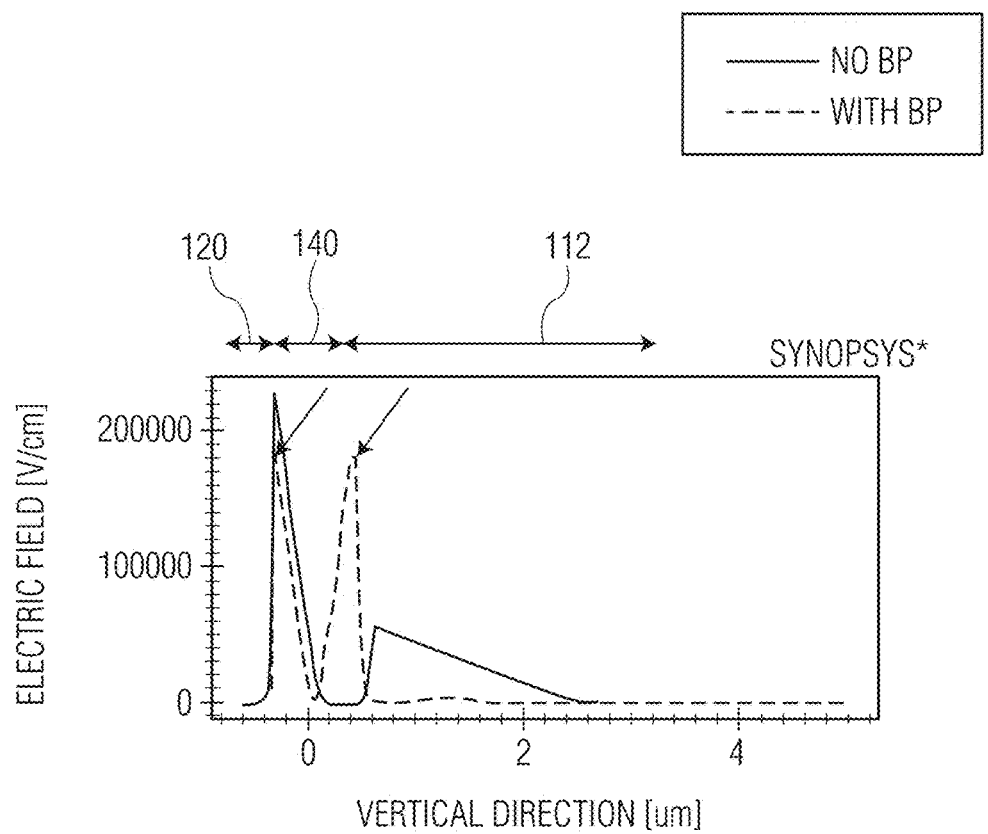
FIG. 3 depicts a comparison of the electric field distribution in a vertical direction for the transistor of FIG. 2 and a comparable transistor without buried doped layer in the substrate.

An example of this field redistribution is shown in FIG. 3, which along the x-axis displays the field distribution in a vertical direction at the right edge of the vertical bipolar transistor 100 as shown in FIG. 2 in the presence and absence of the doped region 112 respectively. The arrows indicate the local maxima in the electric field in the presence of the buried layer 112, thereby demonstrating the RESURF effect at the junction between the laterally extending collector 140 and the buried layer 112, which causes a reduction in the field strength at the base-collector junction compared to the device in which the buried highly doped region 112 is absent. It is noted for the sake of completeness that the area below both curves in the separate peaks equal the applied reverse voltage and is therefore the same for both cases.

Figure 4:
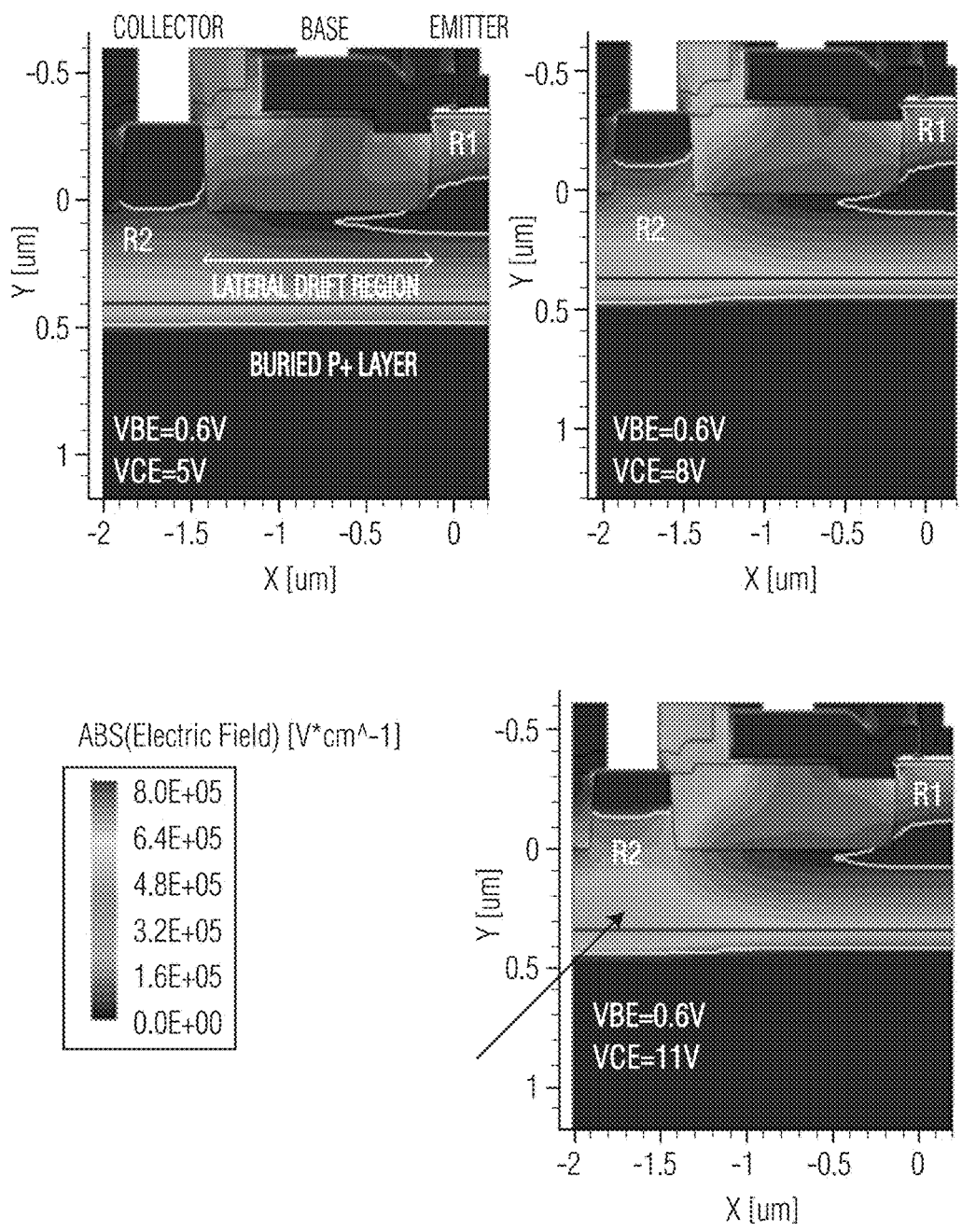
FIG. 4 depicts the simulation results of the electric field in the transistor of FIG. 2 for various voltages at and above $BV_{CEO}$.

FIG. 4 depicts the simulation results of the electric field in the vertical bipolar transistor 100 of FIG. 2 for various $V_{CE} \geq BV_{CEO}$. The legend represents the magnitude of the electric field in V/cm. When $V_{CE}$ is larger than 5V, the field at the base-collector junction (region R1) in the transistor 100 no longer (substantially) increases with increasing $V_{CE}$, i.e. the amount of generated holes in this region due to impact ionization remains constant. Instead, the region below the collector plug (region R2) exhibits increased hole generation for increasing $V_{CE}$ as indicated by the arrow.

Due to the redistribution of the electric fields by the aforementioned junction RESURF effect, most of the holes generated by impact ionization in region R2 migrate directly into the substrate 110, in particular into the doped region 112, and cannot flow towards the base anymore as is the case in the conventional devices such as the bipolar transistor shown in FIG. 1. In other words, the minority charge carriers (here holes) in the collector region 140 are generated away from the collector-base junction and are drained from the collector region 140 by the buried doped region 112 through its further contact terminal 115.

As a result, the base current remains substantially constant for increasing $V_{CE}$ once the electric field at the base-collector junction has been established until a 'physical' breakdown occurs at $BV_{CBO}$. In other words, the intrinsic part of the bipolar transistor 100, i.e. the metallurgical base-collector and base-emitter junctions separated by the relatively thin base region 130 does not "feel" the generated avalanche current anymore because it has been physically separated from the avalanche generation region. Consequently, $BV_{CEO}$ no longer depends on the current gain such that the base current will no longer decrease and become negative due to the generated holes. Conceptually, in the transistor according to embodiments of the present invention, the region that determines $BV_{CEO}$ (i.e. region R1) has been physically separated from the region that determines $BV_{CBO}$ (i.e. region R2).

Figure 5:
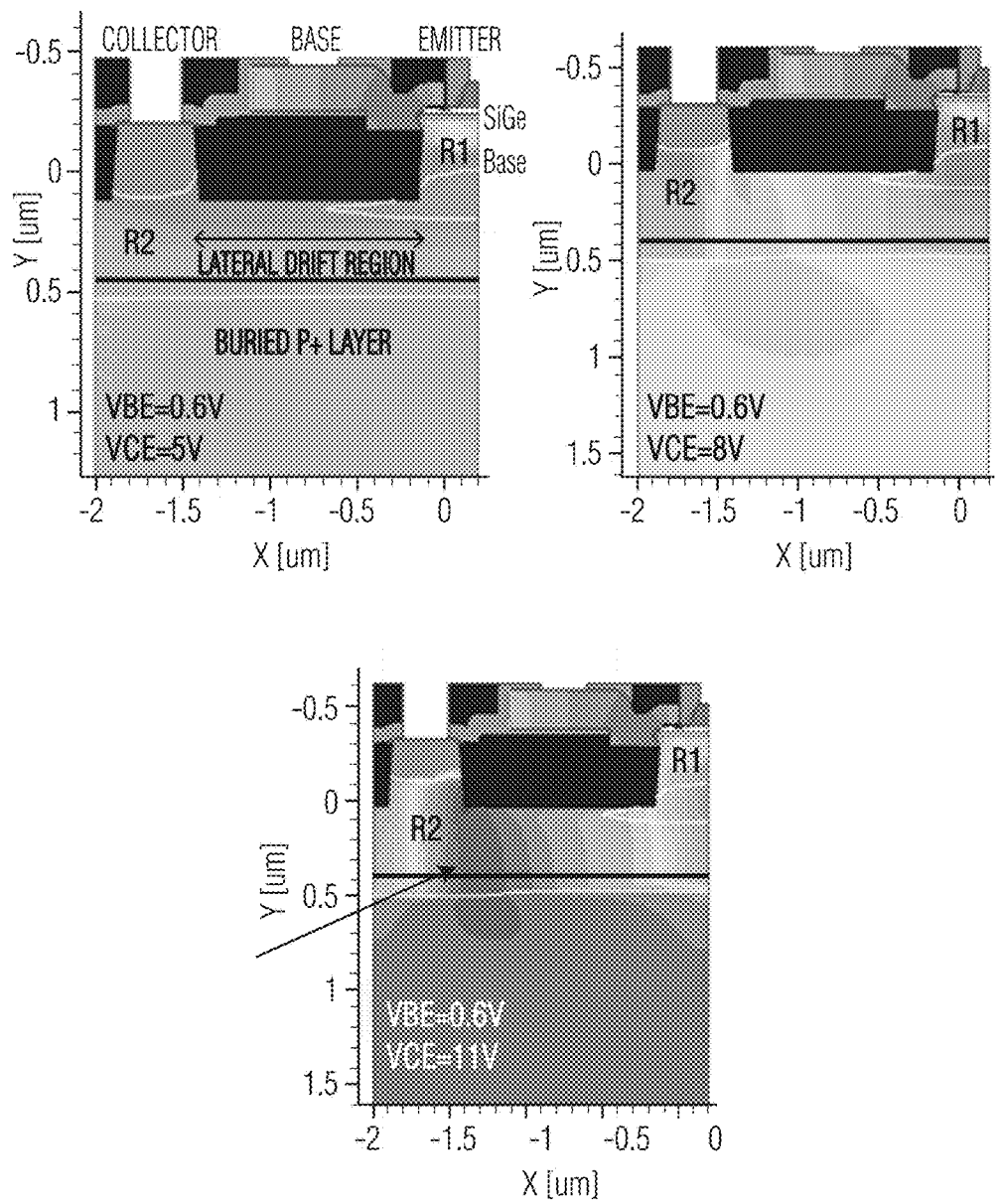
FIG. 5 depicts the simulation results of the hole current distribution in the transistor of FIG. 2 for various voltages at and above $BV_{CEO}$.

FIG. 5 depicts the hole current distribution at various $V_{CE}$ values from TCAD simulations for the vertical bipolar transistor 100 of FIG. 2. The legend represents the magnitude of hole current density in A/cm$^2$. As is apparent from FIG. 5 when compared to FIG. 1, the minority carriers, e.g. holes, at higher $V_{CE}$ drained through the substrate instead of through the base contact in the novel bipolar transistor 100, as also indicated by the arrow in FIG. 5.

The above simulations have been verified by the manufacturing of several vertical bipolar transistors 100 as schematically shown in FIG. 2 in which some device parameters, e.g. the length of the laterally extending collector region 140, have been systematically varied to prove the concept of the present invention.

In this context, for the purpose of illustrating this invention, a device with the following parameters is chosen: lateral collector drift region impurity concentration $N_o = 4 \times 10^{16}$ cm$^{-3}$, lateral collector thickness m=0.6 µm, wherein this thickness is defined as the distance between the collector-base junction (see FIG. 2) and the junction between the collector region 140 and the buried doped region 112, collector drift length $L_D$=0.8, 1.2 and 1.8 µm respectively, wherein the drift length is defined as the lateral separation between the inner edge of the collector-base junction and the inner edge of the portion 144, i.e. the edges facing each other (see FIG. 2). The buried region 112 has been provided with a p-type impurity at a maximum concentration of around $1 \times 10^{18}$ cm$^{-3}$.

It should be understood that the aforementioned parameters have been chosen by way of non-limiting example only, and that the skilled person will understand that these parameters may be varied as long as the dimensions and doping levels of the laterally extended collector region 140 are appropriately matched to the doping levels in the buried doped region 112 in order to establish the desired RESURF effect at the junction between these regions. The creation of a junction RESURF effect is known per se. As these parameters may be varied in many different ways, this will not be explained in further detail for the sake of brevity.

Figure 6:
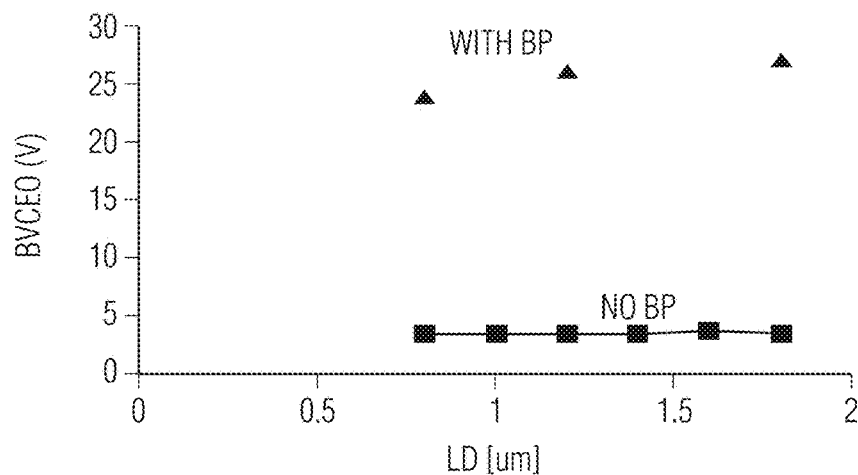
FIG. 6 depicts collector drift length dependence of the measured $BV_{CEO}$ in the presence (triangles) and absence (squares) of the buried doped layer under the drift region.

FIG. 6 depicts the measured breakdown voltage $BV_{CEO}$ for these devices at $V_{BE}$=0.6V (indicated by triangles), which is considered in the ideal collector current region, as well as for devices in which the buried doped layer 112 is absent (indicated by squares). There is a substantial difference in $BV_{CEO}$ between the devices with and without buried doped region 112, which measurements therefore support the expectations from the simulated field distributions shown in FIG. 3. Indeed, for a comparable transistor in which the buried doped region 112 is absent, the RESURF effect is not (or very weakly) present and significant electric field shaping does not take place. Consequently, avalanche effects take place at the base-collector junction resulting in a similar $BV_{CEO}$ as for the vertical bipolar transistors including a vertically implanted collector region, such as the bipolar transistor shown in FIG. 1. In contrast, in the presence of a buried doped region 112, the RESURF effect combined with the relocation of the hole generation region (to region R2 shown in FIGS. 4 and 5) results in substantially increased $BV_{CEO}$ values close to $BV_{CBO}$.

Figure 7:
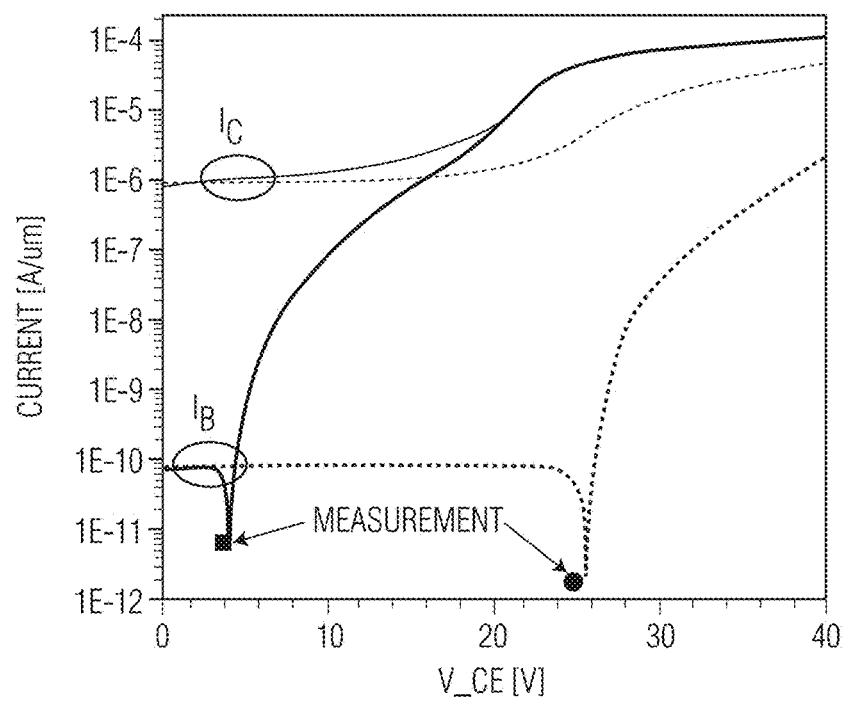
FIG. 7 depicts the measured $BV_{CEO}$ in the presence (dashed lines) and absence (solid lines) of the buried doped layer under the collector drift region by tracking base current $I_B$ and collector current $I_C$.

Base and collector current TCAD simulations for both designs, i.e. a vertical HBT including a laterally extended collector region 140 with (dashed lines) and without (solid lines) buried doped region 112 have also been performed. The results are shown in FIG. 7. It will be immediately apparent that the point at which the base current ($I_B$) changes sign (i.e. $BV_{CEO}$) is substantially different between devices with and without buried doped region 112. The simulation results correspond well with the measured $BV_{CEO}$ values for these devices, which measurement results are also highlighted in FIG. 7 using the word "measurement".

Figure 8:
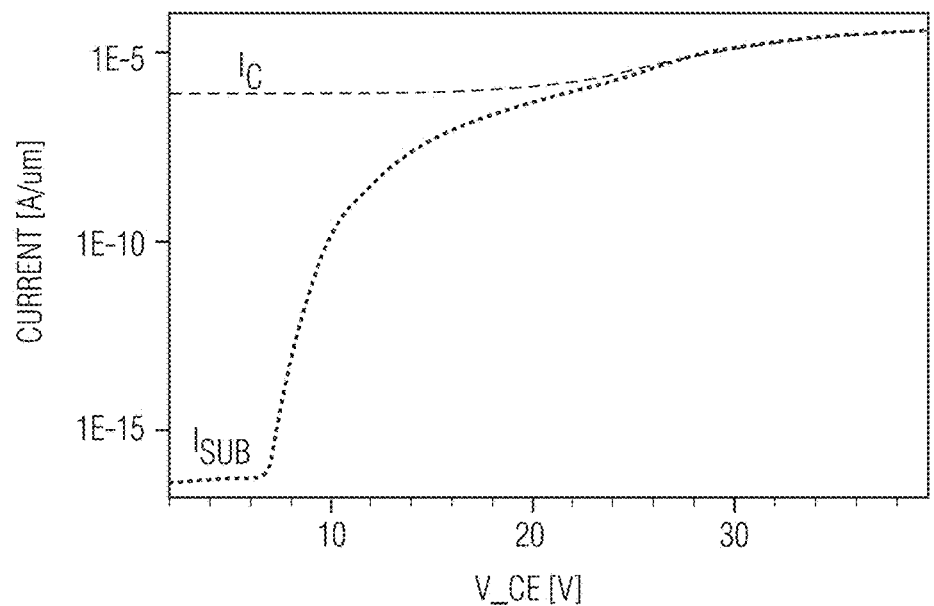
FIG. 8 depicts collector current $I_C$ and substrate current $I_{SUB}$ obtained from simulations on the transistor of FIG. 2.

FIG. 8 depicts the simulation result of the substrate current in the vertical bipolar transistor 100 as shown in FIG. 2, demonstrating the effect of the presence of the buried doped region 112 underneath the laterally extending collector region 140. As can be seen, most of electron/holes at high $V_{CE}$ are generated in region R2, and the generated holes flow to the substrate terminal contact 115 while the generated electrons add to the collector current. This means that in contrast to conventional devices in which the doped region 112 is absent, the substrate current will increase significantly at high $V_{CE}$.

Indeed, at $V_{CE}$ larger than 10V, there is a significant increase in substrate current coming from the holes generated by the avalanche phenomenon, thereby demonstrating that the minority carriers that are generated in the region R2 of the laterally extending collector region 140 are effectively drained by the substrate 110 through the presence of the highly doped region 112. It can furthermore be seen that for very high $V_{CE}$ values, the collector current $I_C$ equals the substrate current $I_{SUB}$, meaning that the total output current of the transistor is fully determined by the avalanche current, i.e. hole current for the substrate 110 and electron current for the collector 140.

At this point, it is noted that although the concept of the present invention has been explained in terms of the first conductivity type being n-type and the second conductivity type being p-type, i.e. in terms of an NPN bipolar transistor, the same principle of course can be applied to a transistor in which the first conductivity type is p-type and the second conductivity type is n-type, i.e. a PNP bipolar transistor.

In addition, although the concept of the present invention has been explained in terms of a vertical (heterojunction) bipolar transistor, it should be understood that the same principles can be applied to a lateral device including a bipolar transistor. A non-limiting example of a lateral bipolar transistor 200 is schematically shown in FIG. 9. In this embodiment, the laterally extended collector region 140 is laterally separated from the emitter region 120 by the base region 130. As before, the laterally extended collector region 140 and the emitter region 120 may be doped with an impurity of the first conductivity type and the base region 130 may be doped with an impurity of the second conductivity type. The substrate 110 includes a highly doped region 112 including an impurity of the second conductivity type in contact with and extending along the laterally extending collector region 140 as previously shown in FIG. 2 in order to provide a p-n junction between the laterally extending collector region 140 and the highly doped region 112 capable of providing the junction RESURF effect as previously explained.

The base region 130 and the emitter region 120 preferably are electrically insulated from the highly doped region 112 by an electrically insulating structure 210, which for instance may be a dielectric layer or a shallow trench isolation structure. The emitter region 120, base region 130 and collector region 140 may be formed in an epitaxially grown layer on the substrate 110 including the doped region 112 and the electrically insulating structure 210 as previously explained. The epitaxially grown layer may for instance be a silicon layer. The formation of such laterally separated emitter region 120, base region 130 and collector region 140 is of course well-known per se and will not be explained in further detail for the sake of brevity only.

The laterally extended collector region 140 typically comprises a portion 144 more highly doped with an impurity of the first conductivity type that provides the contact region for the collector contact terminal 145. The highly doped portion 144 is located at the end of the collector region 140 that is distal to the collector-base junction, i.e. the drift region of the laterally extended collector region 140 separates the highly doped portion 144 from the collector-base junction in order to physically separate the generation of the minority carriers during avalanche conditions from the collector-base junction as previously explained.

The substrate 110 further comprises a highly doped region 114 of the second conductivity type for electrically connecting the buried doped region 112 to the further contact terminal 115. Contact terminals 125 and 135 are provided to the emitter region 120 and base region 130 respectively, as is well known per se.

As explained before, the various parameters of the laterally extending collector region 140, such as impurity concentration, thickness and length of the drift region should be matched with the chosen concentration of the impurities in the buried doped region 112 in order to establish the desired junction RESURF effect at the junction between these regions. As this can be done in many different ways, it is not feasible for reasons of conciseness to explain this in detail in the present application. It suffices to say that the skilled person can achieve such matching using routine skills, as it is known per se to create a junction RESURF effect by choosing the appropriate parameters for the various regions defining such a junction.

As explained in the introductory section of this application, MOS transistors (i.e. MOSFETs) also exhibit the aforementioned breakdown characteristics due to the presence of a parasitic bipolar transistor formed by the junctions between source and well, and between well and drain drift region respectively. Consequently, the characteristics of such a MOSFET may also be improved using the teachings of the present invention. A non-limiting example of such a MOSFET 300 is shown in FIG. 10.

The MOSFET 300 comprises a highly doped region 112 of a second conductivity type in the substrate 110. A drift region 340 is formed on the highly doped region 112 and comprises a lower concentration of an impurity of the first conductivity type. The drift region 340 typically comprises a higher doped portion 342, i.e. the drain of the MOSFET 300, which is laterally separated by an insulation structure 150, e.g. an STI or LOCOS oxide structure, with the drift region 340 extending from the drain 342 underneath this isolation structure 150 to a well 330 doped with an impurity of the second conductivity type in which a source region 320 doped with an impurity of the first conductivity type and a body contact 322 doped with an impurity of the second conductivity type are provided.

The MOSFET 300 further comprises a trench gate electrode 354 in a trench extending through the well 330 and underlying drift region 340, which trench gate electrode 354 is separated from a channel region by a gate insulator 352 such as a gate oxide. The MOSFET 300 further comprises a drain contact terminal 345 contacting the drain region 342 and a source contact terminal 325 contacting the source region 320 (and optionally the body region 322).

Although not shown in FIG. 10, the MOSFET 300 further comprises a further terminal contacting the buried doped region 112 as previously explained. It will be recognized by those skilled in the art that FIG. 10 displays two MOSFETs 300 oriented in a side-by-side fashion. As before, the drain region 342 is laterally separated by the drift region 340 from the p-n junction between the well 330 and the drift region 340 such that the formation of minority carriers resulting from avalanche conditions is moved away from this junction towards the region of the p-n junction between the drift region 340 and the buried doped region 112 in the vicinity of the drain region 342, i.e. by provision of the aforementioned junction RESURF effect in this device.

In the above embodiments, the doped region 112 is implemented as a buried region in the substrate 110, i.e. underneath the drift region of interest. However, it should be understood that embodiments in which the doped region 112 is implemented as a surface region in the substrate 110, i.e. above the drift region of interest, are also feasible. FIG. 11 schematically depicts such an embodiment, in which a lateral MOSFET 300 comprises a first region 320 of the first conductivity type, e.g. a source region, and a laterally extended second region 340 of the first conductivity type, e.g. the drift region, including a more highly doped portion 342, i.e. the drain region.

The first region 320 is separated from the second region 340 by an intermediate region 330 of a second conductivity type, i.e. the bulk region of the substrate 110 underneath the gate electrode 354 of the MOSFET 300, which intermediate region 330 defines a first p-n junction with the first region 320 and a second p-n junction with the second region 340, wherein the laterally extended region 340 separates the portion 342 from the second p-n junction. In this embodiment, the doped region 112 of the second conductivity is placed over the drift region 340, such that the drift region 340 laterally extends underneath the doped region 112 whilst still being in contact with the doped region 112, such that the doped region 112 can be used to remove minority charge carriers from the drift region 340 through contact terminal 115 as previously explained.

As before, the gate electrode 354 is separated from the channel region in the body region 330 by a gate insulating layer 352, e.g. a gate oxide, a high-k dielectric material and so on, whereas the source, gate and drain are provided with respective contacts 325, 355 and 345 as previously explained with the aid of FIG. 10.

The transistors according to embodiments of the present invention may be advantageously integrated into an amplifier circuit such as an RF amplifier circuit, as this provides an amplifier circuit having improved amplification characteristics due to the fact that the transistor can be operated at higher $V_{CE}$ as previously explained. A particularly advantageous embodiment is provided if the vertical bipolar transistor of FIG. 2 is included in such an amplifier circuit, as such a transistor can be operated at high frequencies, especially when the transistor is a vertical HBT device as previously explained. The design of such amplifier circuits is known per se and will therefore not be explained in further detail for reasons of brevity only.

The transistors according to embodiments of the present invention may be advantageously integrated into an IC to provide an IC having improved breakdown characteristics. The IC may for instance contain the aforementioned amplifier circuit, or alternatively or additionally may contain transistors according to embodiments of the present invention in other circuits.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A transistor having a first region of a first conductivity type for injecting charge carriers into the transistor and a laterally extended second region of the first conductivity type having a portion including a contact terminal for draining said charge carriers from the transistor, wherein the first region is separated from the laterally extended second region by an intermediate region of a second conductivity type defining a first p-n junction with the first region and a second p-n junction with the laterally extended second region, wherein the laterally extended second region separates the portion from the second p-n junction, and wherein the transistor further comprises:

a substrate having a doped region of the second conductivity type, said doped region being in contact with and extending along the laterally extended second region, wherein the doped region has a higher doping concentration than the laterally extended second region; and
a further contact terminal connected to the doped region for draining minority charge carriers from the laterally extended second region.

2. The transistor of claim 1, wherein the maximum concentration of the doping in the doped region optionally is in the range of $10^{17}$-$10^{19}$ cm$^{-3}$.

3. The transistor of claim 1, wherein the first conductivity type is n-type and the second conductivity type is p-type.

4. The transistor of claim 1, wherein the first conductivity type is p-type and the second conductivity type is n-type.

5. The transistor of claim 1, wherein the first region is an emitter region, the intermediate region is a base region and the laterally extended second region is a collector region, wherein the collector region is formed in the substrate, the base region is formed on the collector region and the emitter region is formed on the base region.

6. The transistor of claim 5, wherein the portion is laterally separated from the second p-n junction by a trench insulation region, said collector region extending from the second p-n junction to the portion underneath the trench insulation region.

7. The transistor of claim 5, wherein the collector region has a thickness in the range of 0.1-1.0 µm and a concentration of an impurity of the first conductivity type in the range of $10^{16}$-$10^{19}$ cm$^{-3}$.

8. The transistor of claim 5, wherein the collector region laterally extends over a width in the range of 0.5-5.0 µm.

9. The transistor of claim 5, wherein the transistor is a heterojunction bipolar transistor comprising a SiGe base region.

10. The transistor of claim 1, wherein the first region is an emitter region, the intermediate region is a base region and the laterally extended second region is a collector region, wherein the emitter region, the base region and the collector region each are formed in the substrate and laterally separated from each other, and wherein the emitter region and the base region are separated from the doped region by a patterned electrically insulating layer.

11. The transistor of claim 1, wherein the first region is a source region and the second region is a drain region including a drift region, and wherein the intermediate region is a well comprising the first region, the transistor further comprising a channel region in between the source region and the drain region.

12. An amplifier circuit comprising the transistor of claim 1.

13. The amplifier circuit of claim 12, wherein the amplifier circuit is a RF amplifier.

14. An integrated circuit comprising the transistor of claim 1.

15. The integrated circuit of claim 14, wherein the transistor is included in an amplifier circuit.

* * * * *